United States Patent [19]

Kobayashi

[11] Patent Number: 4,731,761
[45] Date of Patent: Mar. 15, 1988

[54] SEMICONDUCTOR MEMORY
[75] Inventor: Toshifumi Kobayashi, Itami, Japan
[73] Assignee: Mitsubishi Denki Kabushiki Kaisha, Tokyo, Japan
[21] Appl. No.: 915,679
[22] Filed: Oct. 6, 1986
[30] Foreign Application Priority Data Oct. 4, 1985 [JP] Japan .................................. 60-222103

[51] Int. Cl.$^4$ .............................................. G11C 13/00
[52] U.S. Cl. ..................................... 365/230; 365/189
[58] Field of Search ........................ 365/189, 230, 231

[56] References Cited

U.S. PATENT DOCUMENTS 4,429,374 1/1984 Tanimura .

FOREIGN PATENT DOCUMENTS 57-3289 8/1982 Japan .

OTHER PUBLICATIONS

"A 35ns 64K Static Column DRAM", Fumio Baba et al., IEEE Journal of Solid-State Circuits, Digest of Technical Papers, Feb. 1983, pp. 64-65.
Nikkei Electronics, 1983, F. Baba et al., vol. 9-12, pp. 153-174.

Primary Examiner—Terrell W. Fears
Attorney, Agent, or Firm—Lowe, Price, Leblanc, Becker & Shur

[57] ABSTRACT

A dynamic RAM with static column function comprising a predecoder for predecoding both the row address and the column address to output intermediate signals, a row decoder composed of NOR circuits for selecting one row in response to said intermediate signals, a column decoder composed of NAND circuits for selecting one column in response to said intermediate signals, and a logic inversion circuit for matching the logics for the intermediate signal between the row decoder and the column decoder.

4 Claims, 11 Drawing Figures (n = 0,1,2,3)

PREDECODER ENABLE

⊐D⊶ NAND GATE

FROM ROW DECODER $\overline{Z_i}$ → $Z_i$ TO COLUMN DECODER $i = 0, 1, \cdots, 15$

SEMICONDUCTOR MEMORY

BACKGROUND OF THE INVENTION

1. Field of the Invention

The present invention relates to an address decoder of a semiconductor memory, and particularly to a structure of an address decoder for a CMOS type dynamic RAM having static column function.

2. Description of the Prior Art

An address decoder for selecting one memory cell from a memory cell array included in a semiconductor memory is formed of a plurality of transistors, which are connected in series or in parallel and are switch-controlled by address signals.

Recently, a semiconductor memory has come to be implemented in a large capacity, increasing the number of bits required for address signals, so that the number of transistors forming an address decoder must be increased correspondingly. This increases the load capacitance of an address signal line, so that the speed of operation of an address decoder is greatly limited. On the other hand, this increases the area of device region required for forming an address decoder on a semiconductor chip.

In order to solve the above described problems, an address predecoding method such as shown in, e.g. Japanese Patent Laying-Open Gazette No. 3289/1982 has been proposed.

FIG. 1 shows one example of a structure of a conventional address decoder according to the address predecoding method. In FIG. 1, a conventional address decoder comprises an address buffer circuit 1 for receiving an externally applied address input signals Ext. Ai ($i=0,1,...,5$) to output the complementary address signal Ai, $\overline{Ai}$ a predecoder circuit 2 composed of four 2-input NAND gates for receiving and predecoding address signals $A_{2j}$, $\overline{A_{2j}}$, $A_{2j+1}$, and $\overline{A_{2j+1}}$, from corresponding two address buffer circuits 1 to output intermediate signals $Z_{4j}$, $Z_{4j+1}$, $Z_{4j+2}$ and $Z_{4j+3}$ and, an NAND type unit decoder 3 composed of three parallel-connected p channel MOS transistors $P_{11} \sim P_{13}$ and three series-connected n channel MOS transistors $N_{11} \sim N_{13}$ for receiving and decoding a part of the intermediate signals from all of the predecoder circuits 2 to output a selection signal $\overline{S_k}$ ($k=0,...,63$). $V_{CC}$ denotes the positive supply potential and $V_{SS}$ denotes the negative supply potential.

The operation will now be described with reference to FIG. 1. The address buffer circuit 1 receives an external address input signal Ext.Ai and applies complementary address signals Ai, $\overline{Ai}$ to the predecoder circuit 2. The predecoder circuit 2 receives the address signals $A_{2j}$, $\overline{A_{2j}}$, $A_{2j+1}$ and $\overline{A_{2j+1}}$ and outputs the intermediate signals $Z_{4j}$, $Z_{4j+1}$, $Z_{4j+2}$, and $Z_{4j+3}$ which satisfy the following equations (1)~(4).

$$Z_{4j} = \overline{A_{2j} \cdot A_{2j+1}} \tag{1}$$

$$Z_{4j+1} = \overline{A_{2j} \cdot \overline{A_{2j+1}}} \tag{2}$$

$$Z_{4j+2} = \overline{\overline{A_{2j}} \cdot A_{2j+1}} \tag{3}$$

$$Z_{4j+3} = \overline{\overline{A_{2j}} \cdot \overline{A_{2j+1}}} \tag{4}$$

where, $j = 0, 1, 2$.

The unit decoder 3 receives a predetermined part of the intermediate signals $Z_0 \sim Z_{11}$ from the predecoder circuit 2 (one from each of the predecoder circuits, i.e.; three signals in total) evaluates the negative logical product thereof and outputs a selection signal $\overline{S_k}$($k=0$, ...63). For example, a unit decoder receiving the intermediate signals $Z_0$, $Z_4$ and $Z_8$ outputs a selection signal $\overline{S_0}$ through the operation shown by the following equation (5).

$$\overline{S_0} = \overline{Z_0 \cdot Z_4 \cdot Z_8} \tag{5}$$

$$= \overline{(\overline{A_0 \cdot A_1}) \cdot (\overline{A_2 \cdot A_3}) \cdot (\overline{A_4 \cdot A_5})}$$

$$= A_0 + A_1 + A_2 + A_3 + A_4 + A_5$$

Accordingly, when the address signals $A_0 \sim A_5$ are all "L", the selection signal $\overline{S_0}$ becomes "L" and a signal line connected to the unit decoder output is selected.

FIG. 2 shows another structure of a conventional address decoder according to the predecoding method.

Different from the structure of FIG. 1, the predecoder circuit 4 for receiving and predecoding the address signals $A_{2j}$, $\overline{A_{2j}}$, $a_{2j+1}$ and $\overline{A_{2j+1}}$ ($j=0,1,2$) to output an intermediate signal is composed of four 2-input NAND gates in the structure of FIG. 2. The unit decoder 5 for receiving and decoding a predetermined set of three intermediate signals from all intermediate signals to output a selection signal is composed of a 3-inputs and 1-output NOR circuit comprising three series-connected p channel MOS transistors and three parallel-connected n channel MOS transistors. Namely, in this structure, the predecoder circuit 4 outputs active low intermediate signals $\overline{Z_{4j}}$, $\overline{Z_{4j+1}}$, $\overline{Z_{4j+2}}$, and $\overline{Z_{4j+3}}$. On the other hand, the NOR type unit decoder 5 outputs an active high selection signal $S_k$ ($k=0,...63$) in response to the applied intermediate signal.

The operation will now be described with reference to FIG. 2.

The predecoder circuit 4 receives the address signals $A_j$, $\overline{A_j}$, $A_{j+1}$ and $\overline{A_{j+1}}$ from the address buffer circuit 1, evaluates respective negative logical products and outputs intermediate signals $\overline{Z_{4j}}$, $\overline{Z_{4j+1}}$, $\overline{Z_{4j+2}}$ and $\overline{Z_{4j+3}}$ which satisfy the following equations (6)~(9).

$$\overline{Z_{4j}} = \overline{A_{2j} \cdot A_{2j+1}} = \overline{A_{2j}} + \overline{A_{2j+1}} \tag{6}$$

$$\overline{Z_{4j+1}} = \overline{A_{2j} \cdot \overline{A_{2j+1}}} = \overline{A_{2j}} + A_{2j+1} \tag{7}$$

$$\overline{Z_{4j+2}} = \overline{\overline{A_{2j}} \cdot A_{2j+1}} = A_{2j} + \overline{A_{2j+1}} \tag{8}$$

$$\overline{Z_{4j+3}} = \overline{\overline{A_{2j}} \cdot \overline{A_{2j+1}}} = A_{2j} + A_{2j+1} \tag{9}$$

where, $j=0, 1, 2$.

The unit decoder 5 receives one predetermined intermediate signal from each of the predecoder circuits 4 (three intermediate signals in total), evaluates negative logic sum thereof and outputs a selection signal $S_k$ ($k=0, \ldots 63$). For example, a unit decoder receiving intermediate signals $\overline{Z_0}$, $\overline{Z_4}$, and $\overline{Z_8}$ outputs a selection signal $S_0$ which satisfies the following equation (10).

$$S_0 = \overline{\overline{Z_0} + \overline{Z_4} + \overline{Z_8}} \tag{10}$$

$$= \overline{(A_0 + A_1) + (A_2 + A_3) + (A_4 + A_5)}$$

$$= \overline{A_0} \cdot \overline{A_1} \cdot \overline{A_2} \cdot \overline{A_3} \cdot \overline{A_4} \cdot \overline{A_5}$$

Therefore, when address signals $A_1 \sim A_5$ are all "L", this unit decoder only is selected and the selection signal $S_0$ becomes "H". Accordingly, only the signal line for receiving the selection signal $S_0$ is selected.

As described above with reference to FIGS. 1 and 2, in an address decoder using the predecoding method, a unit decoder for decoding 6-bit address information $A_0 \sim A_6$ is composed of a 3-input NAND circuit or 3-input NOR circuit. If the predecoding method is not used, a unit decoder for decoding the 6-bit address informtion must be composed of 6-input NAND or NOR circuit. Accordingly, by employing the predecoding mehtod, the number of elements required for composing a unit decoder can be decreased to ½. Consequently, the number of element connected to the address information line becomes a half, so that the load capacitance on the address information line is greatly decreased, enabling the rapid operation of address decoding. In addition, due to the decrease of the number of elements the areas of element region forming the address decoder can be reduced.

However, in the conventional predecoding method, if the unit decoder is composed of a NAND circuit, the predecoder must output NOR outputs (i.e., active-high signal) and if the unit decoder is an NOR circuit, the predecoder must output NAND outputs (i.e., active-low signal) due to the above described circuit structure.

Recently, a DRAM (dynamic random access memory) having static column function has been developed in order to improve the access time of a semiconductor memory. Details of the static column function is disclosed in F. Baba et al., "A 35 ms 64k Static Column DRAM", ISSCC Digest of Technical Papers, Feb. 1983, pp.64–65 and F. Baba et al., Nikkei Electronics 1983, vol. 9–12, pp. 153–174. Therefore, the description is omitted.

In the CMOS type DRAM having static column function, the column decoder and not the row decoder requires the static operation. Therefore, in view of the rapidity of the decoder and the number of elements forming the decoder, a combination of a row decoder formed of nMOS dynamic NOR circuits and column decoder composed of CMOS static NAND circuits is most preferable. However, as described above, in order to form a decoder employing the combination of an NOR type row decoder and an NAND type column decoder, a predecoder must be provided for each of the row address and the column address. Alternatively, in order to use the predecoder both for the row address and the column address, the row decoder and the column decoder must be composed of circuits of the same type. Therefore, in either case, a decoder cannot be constructed in its most suitable way in view of its performance or the number of elements for composing the circuit.

An address decoder using the predecoding method with an address decoder for one axis composed of an NAND circuit and an address decoder for the other axis composed of an NOR circuit is disclosed in U.S. Pat. No. 4,429,374 "Memory Array Addressing" by Tanimura.

SUMMARY OF THE INVENTION

An object of the present invention is to eliminate the above described problems of the prior arts and to apply the predecoding method to a DRAM, specifically to a DRAM with static column function in the most suitable way, thereby to provide a high speed and highly area-effective DRAM, specifically a DRAM with static column function.

A semiconductor memory employing the predecoding method according to the present invention comprises a predecoder used both for the row address and column address, a row decoder composed of NOR circuits, a column decoder composed of NAND circuits and a logic inversion circuit for matching the address information logic between the row decoder and the column decoder.

In the above described structure, the predecoder outputs an intermediate signal of a logic matching either with the row decoder or the column decoder and, the intermediate signal from the predecoder is applied to the decoder of which logic is not matching with the output logic of the predecoder through the logic inversion circuit.

Accordingly, the predecoding method can be applied to the DRAM with a static column function in the most suitable way, providing a DRAM with a static column function with high speed and high area-effectiveness.

These and other objects and features of the present invention will be more apparent from the following detailed description with reference to the drawings.

DESCRIPTION OF THE PREFERRED EMBODIMENTS

Figure 1:
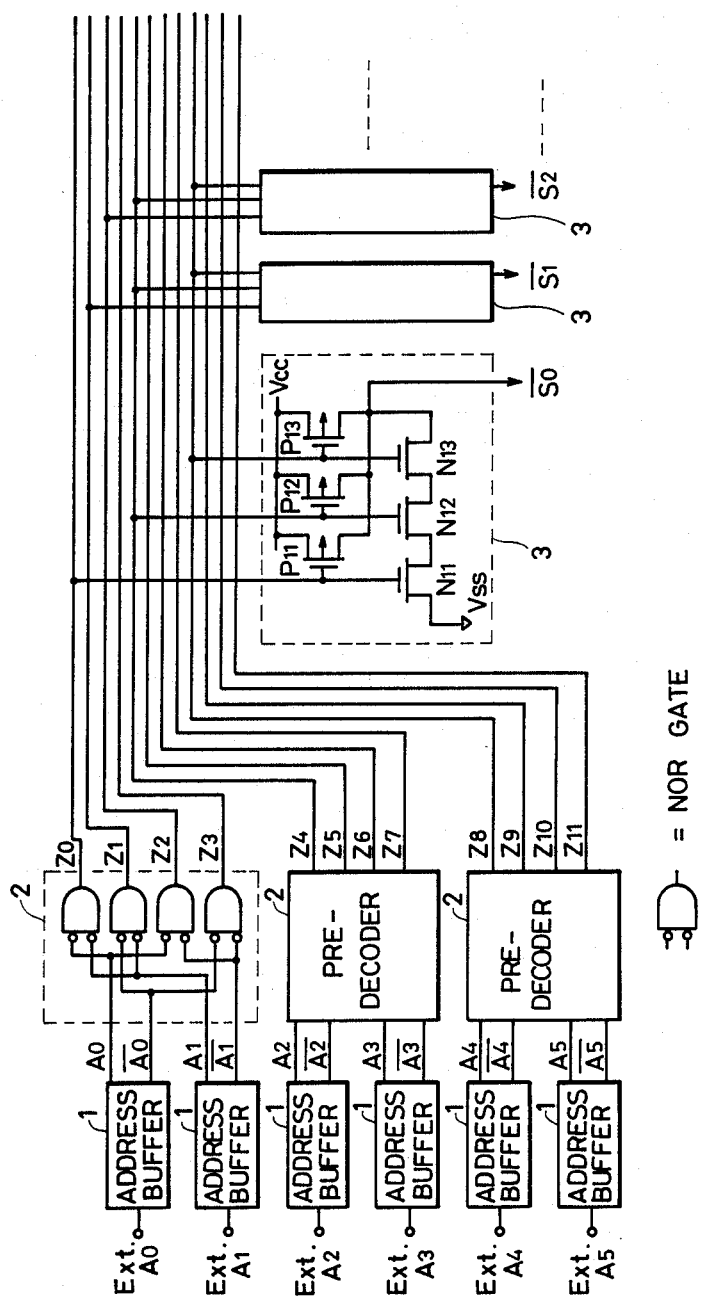
Fig. 1 is a schematic diagram showing one structure of a conventional address decoder employing the predecoding method.
Figure 2:
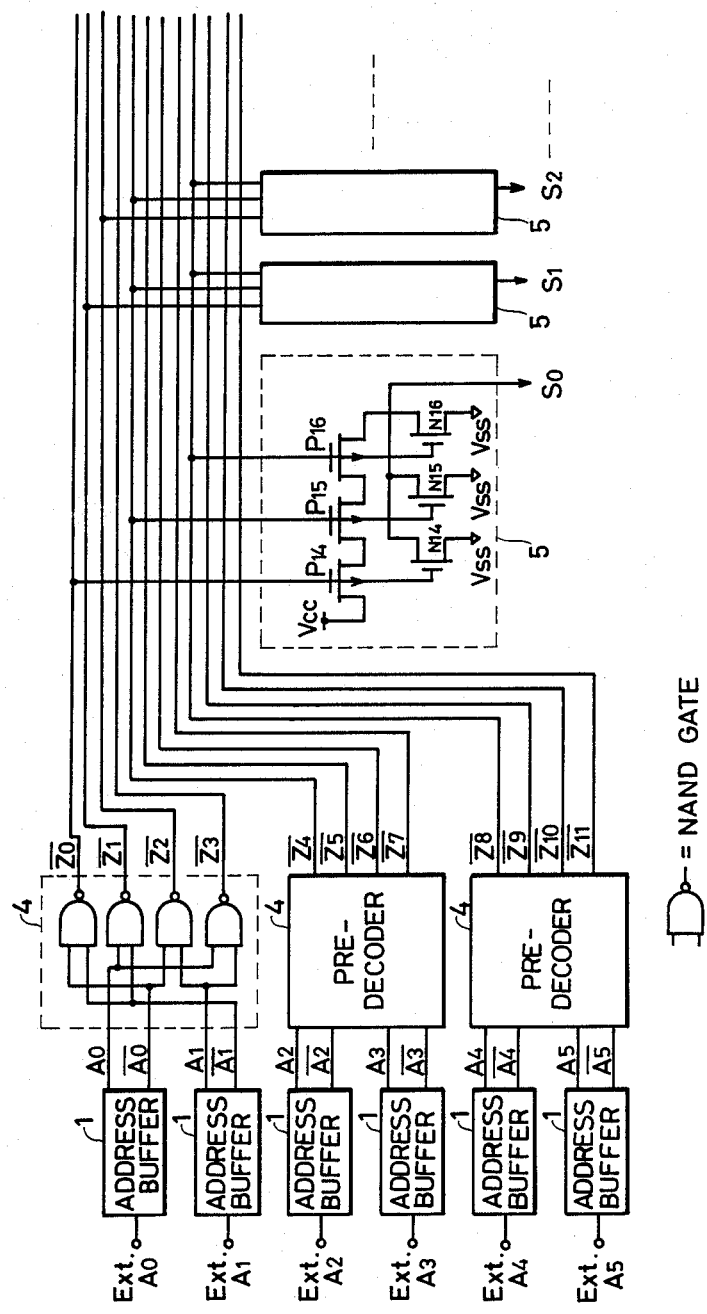
FIG. 2 is a schematic diagram showing another structure of a conventional address decoder employing the predecoding method.
Figure 3:
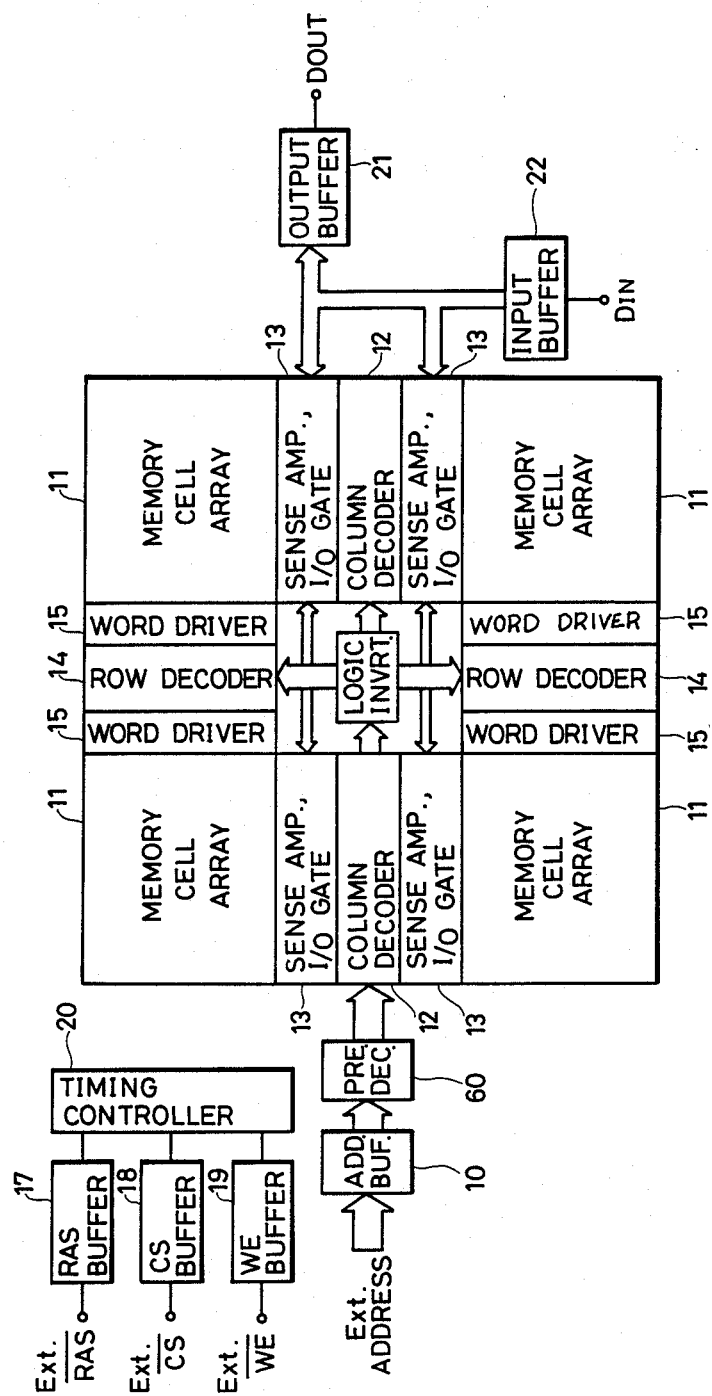
FIG. 3 is a block diagram showing the structure of a semiconductor memory according to one embodiment of the present invention.

FIG. 3 is a block diagram showing the structure of a semiconductor memory according to one embodiment of the present invention.

In FIG. 3, the semiconductor memory comprises a memory cell array 11 composed of a plurality of memory cells arranged in a matrix form of rows and columns, an address buffer circuit 10 used for both row and column addresses for receiving an external address signal which specifies a single memory cell included in the memory cell array 11 to arrange the waveform thereof, a predecoder circuit 60 for predecoding an address signal from the address buffer circuit 10 and for outputting an intermediate signal, a column decoder 12 for outputting a column selection signal in response to the intermediate signal from the predecoder 60, a row decoder 14 for outputting a row selection signal in response to the intermediate signal from the predecoder 60 and, a logic inversion circuit 16 provided between the predecoder 60 and the column decoder 12 and the row decoder 14, for establishing logic matching of the row decoder 14 and the column decoder 12 with respect to the intermediate signal from the predecoder 60. A word driver 14 for activating one row (word line) selected by the row decoder 14 is provided between the memory cell array 11 and the row decoder 14.

A sense amplifier and I/O gate 13 for supplying and receiving input data $D_{IN}$ and output data $D_{OUT}$ to and from the memory cell array 11 is provided between the memory cell array 11 and the data input buffer 22 and data output buffer 21.

On the other hand, in order to control the operation timing of the semiconductor memory, provided are an RAS clock buffer 17 for receiving an external row address strobe signal Ext.$\overline{RAS}$ for providing the timing of strobing the row address and for outputting an internal RAS signal, a CS clock buffer 18 for receiving an external chip select signal Ext.$\overline{CS}$ for providing the timing for data input and output and for outputting an internal CS signal, a WE clock buffer 19 for receiving an external write enable signal Ext.$\overline{WE}$ for applying an instruction for data writing operation and for outputting an internal WE signal, and a timing control circuit 20 for controlling the operation timing of the semiconductor memory in response to the clock signals from the buffers 17, 18 and 19.

In a DRAM with static column function, $\overline{CS}$ is used instead of the signal $\overline{CAS}$ (column address strobe) for controlling the timing of the column selection.

The structure of circuits in each block will now be described with reference to the drawings with regard to the case where the semiconductor memory has a memory capacity of 65,536 bits (256 rows by 256 columns).

Figure 4:
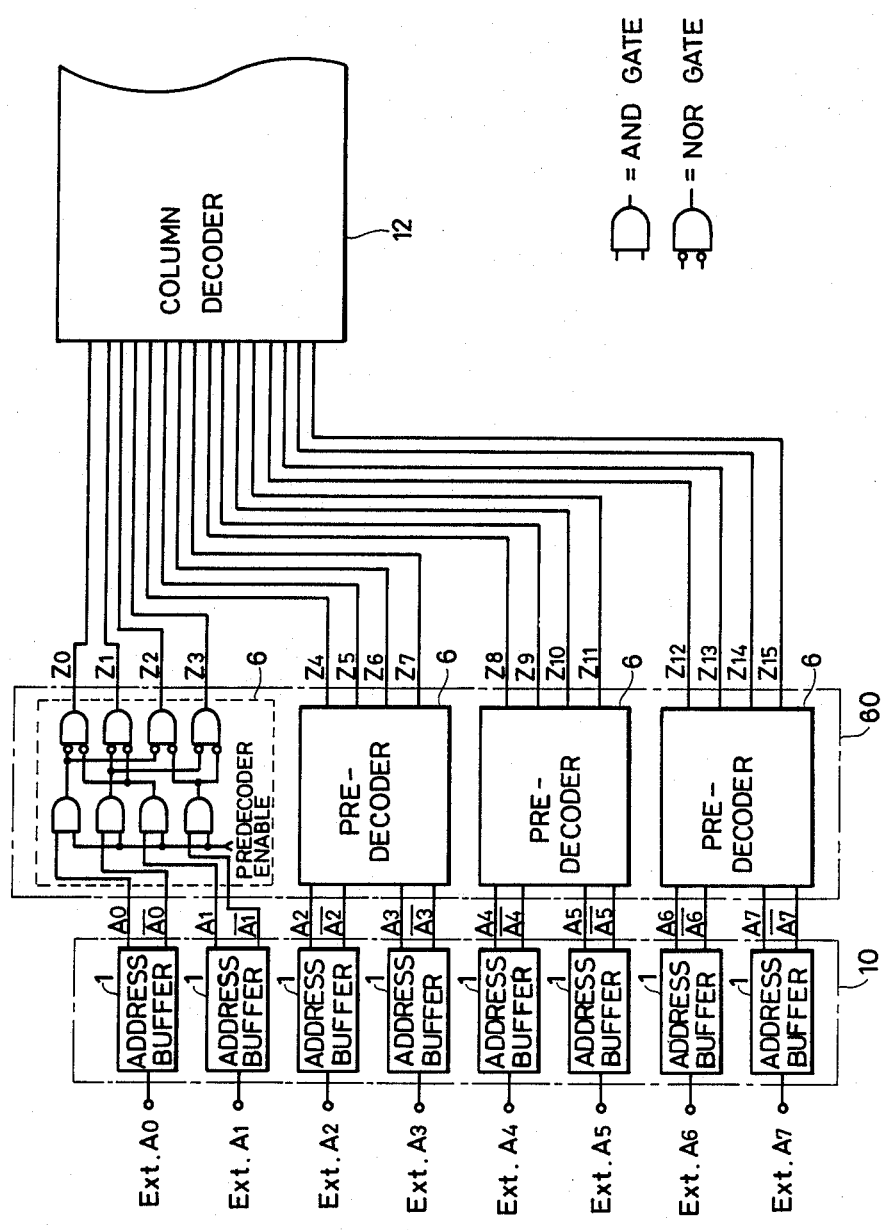
FIG. 4 shows one example of a structure of an address buffer circuit and a predecoder circuit according to the present invention.

FIG. 4 shows one example of the structure of the address buffer circuit and the predecoder shown in FIG. 3.

In FIG. 4, the address buffer circuit 10 comprises address buffer circuits 1 each of which receives an external address input signal Ext.A1 (1=0, 1, . . . ,7) and outputs address signals A1, $\overline{A1}$ which are complementary with each other. The predecoder 60 comprises four predecoders 6 composed of four 2-input AND gate and four 2-input NOR gates, each of which receives address signals $A_{2m}$, $\overline{A_{2m}}$, $A_{2m+1}$ and $\overline{A_{2m+1}}$ (m=0,1,2,3) from the address buffer circuit 10 and a predecoder enable signal PREDECODER ENABLE for providing the operation timing of the predecoder 60 and performs the logic operation represented by the following equations (11)~(14) to output intermediate signals $Z_{4m}$, $Z_{4m+1}$, $Z_{4m+2}$ and $A_{4m+3}$.

$$Z_{4m}=\overline{(A_{2m}\cdot A_{2m+1})}+\overline{(\text{PREDECODER ENABLE})} \qquad (11)$$

$$Z_{4m+1}=\overline{(A_{2m}\cdot \overline{A_{2m+1}})}+\overline{(\text{PREDECODER ENABLE})} \qquad (12)$$

$$Z_{4m+2}=\overline{(\overline{A_{2m}}\cdot A_{2m+1})}+\overline{(\text{PREDECODER ENABLE})} \qquad (13)$$

$$Z_{4m+3}=\overline{(\overline{A_{2m}}\cdot \overline{A_{2m+1}})}+\overline{(\text{PREDECODER ENABLE})} \qquad (14)$$

where m=0, 1, 2, 3.

In this structure, the output from the predecoder 60 is an active-high signal. The intermediate signals from the predecoder 60 are applied to the column decoder 12.

Figure 5:
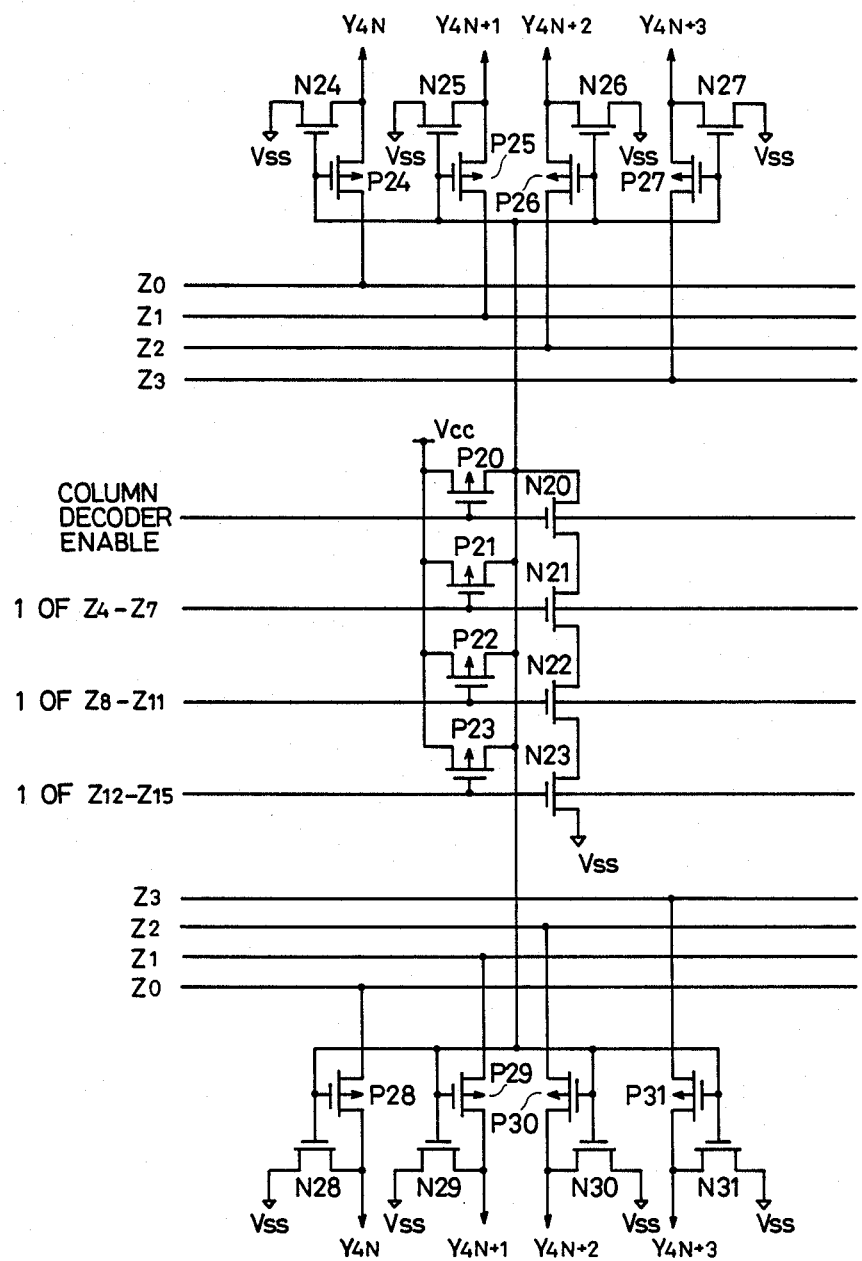
FIG. 5 shows one example of a structure of a unit row decoder forming the row decoder according to the present invention.

FIG. 5 shows one example of a structure of a unit column decoder forming the column decoder shown in FIG. 4.

In FIG. 5, the unit column decoder comprises a CMOS type static NAND circuit which receives a column decoder control signal COLUMN DECODER ENABLE for activating the column decoder and a predetermined set of three intermediate signals from the predecoder 60 for outputting the negative logical product thereof, and a CMOS logic gate for evaluating the logical product of the inverted signal of the NAND circuit output and each of the intermediate signals $Z_0$, $Z_1$, $Z_2$ and $Z_3$ for outputting selection signals $Y_{4n}$, $Y_{4n+1}$, $Y_{4n+2}$ and $Y_{4n+3}$.

A CMOS static NAND circuit is composed of four parallel-connected p channel MOS transistors $P_{20}\sim P_{23}$ and four series-connected n channel MOS transistors $N_{20}\sim N_{23}$. Namely, the pMOS transistor $P_{20}$ and the nMOS transistor $N_{20}$ receive a signal COLUMN DECODER ENABLE at their gates, the pMOS transistor $P_{21}$ and the nMOS transistor $N_{21}$ receive one of the intermediate signals $Z_4\sim Z_7$ at their gates, the pMOS transistor $P_{22}$ and the nMOS transistor $N_{22}$ receive one of the intermediate signals $Z_8\sim Z_{11}$ at their gates and the pMOS transistor $P_{22}$ and the nMOS transistor $N_{22}$ receive one of the intermediate signals $Z_{12}\sim Z_{15}$ at their gates. One conduction terminal of each of the pMOS transistors $P_{20}\sim P_{23}$ is connected to the supply potential $V_{CC}$, while the other conduction terminal is connected in common to the NAND circuit output signal line. The nMOS transistors $N_{20}\sim N_{23}$ are connected in series with each other, one conduction terminal of the nMOS transistor $N_{20}$ is connected to the NAND circuit output signal line and the other conduction terminal of the nMOS transistor $N_{23}$ is connected to the ground potential $V_{SS}$.

The logic gate portion for outputting a selection signal is composed of two portions. One selection signal output portion is formed of four pMOS transistors $P_{24}\sim P_{27}$ and four nMOS transistors $N_{24}\sim N_{27}$. An NAND circuit output signal is applied to all gates of the pMOS transistors $P_{24}\sim P_{27}$ and the nMOS transistors $N_{24}\sim N_{27}$.

One conduction terminal of the pMOS transistor $P_{24}$ receives the intermediate signal $Z_0$, while the other conduction terminal is connected to one conduction terminal of the nMOS transistor $N_{24}$ and at the same time outputs a selection signal $Y_{4N}$.

Similarly, the pMOS transistor $P_{25}$ and the nMOS transistor $N_{25}$ are provided for an intermediate signal $Z_1$ for outputting a selection signal $Y_{4n+1}$ responsive to the NAND circuit output and the intermediate signal $Z_1$. The pMOS transistor $P_{26}$ and the nMOS transistor $N_{26}$ are provided for an intermediate signal $Z_2$ for outputting a selection signal $Y_{4N+2}$ responsive to the NAND circuit output and the intermediate signal $Z_2$. The pMOS transistor $P_{27}$ and the nMOS transistor $N_{27}$ are provided for an intermediate signal $Z_3$ for outputting a selection signal $Y_{4N+3}$ responsive to the intermediate signal $Z_3$ and the NAND circuit output.

The other part of the logic gate for selection signal generation is of the same structure as the logic gate described above, comprising pMOS transistors $P_{28} \sim P_{31}$ and nMOS transistors $N_{28} \sim N_{31}$. The pMOS transistor $P_{28}$ and the nMOS transistor $N_{28}$ are provided for an intermediate signal $Z_0$ for outputting a selection signal $Y_{4N}$. The pMOS transistor $P_{29}$ and the nMOS transistor $N_{29}$ are provided for an intermediate signal $Z_1$, the pMOS transistor $P_{30}$ and the nMOS transistor $N_{30}$ are provided for an intermediate signal $Z_2$, and the pMOS transistor $P_{31}$ and the nMOS transistor $N_{31}$ are provided for an intermediate signal $Z_3$, respectively, for outputting selection signals $Y_{4N+1}$, $Y_{4N+2}$ and $Y_{4N+3}$, respectively.

When a control signal COLUMN DECODER ENABLE becomes "H", the NAND circuit is activated to decode a supplied intermediate signal. The logic gate portion outputs selection signals $Y_{4N}$, $Y_{4N+1}$, $Y_{4N+2}$ and $Y_{4N+3}$ which satisfy the following equation (15) in response to the NAND circuit output and the intermediate signals $Z_0 \sim Z_3$.

$$Y_{4N+t} 32\ Z_t \overline{X} \tag{15}$$

$t = 0, 1, 2, 3,$ $n = 0, 1, 2, \ldots 63$

X: NAND circuit output

For example, the unit decoder circuit constructed so as to receive the intermediate signals $Z_4$, $Z_8$ and $Z_{12}$ provides decoded signals $Y_0$-$Y_3$ satisfying the following equations (15a)–(15d):

$$Y_0 = Z_0 \cdot Z_4 \cdot Z_8 \cdot Z_{12} \cdot CDE \tag{15a}$$

$$= (\overline{A_0} \cdot \overline{A_1} \cdot \overline{A_2} \cdot \overline{A_3} \cdot \overline{A_4} \cdot \overline{A_5} \cdot \overline{A_6} \cdot \overline{A_7} + \overline{PDE}) \cdot CDE$$

$$Y_1 = Z_1 \cdot Z_4 \cdot Z_8 \cdot Z_{12} \cdot CDE \tag{15b}$$

$$= (A_0 \cdot \overline{A_1} \cdot \overline{A_2} \cdot \overline{A_3} \cdot \overline{A_4} \cdot \overline{A_5} \cdot \overline{A_6} \cdot \overline{A_7} + \overline{PDE}) \cdot CDE$$

$$Y_2 = Z_2 \cdot Z_4 \cdot Z_8 \cdot Z_{12} \cdot CDE \tag{15c}$$

$$= (\overline{A_0} \cdot A_1 \cdot \overline{A_2} \cdot \overline{A_3} \cdot \overline{A_4} \cdot \overline{A_5} \cdot \overline{A_6} \cdot \overline{A_7} + \overline{PDE}) \cdot CDE$$

$$Y_3 = Z_3 \cdot Z_4 \cdot Z_8 \cdot Z_{12}\ CDE \tag{15d}$$

$$= (A_0 \cdot A_1 \cdot \overline{A_2} \cdot \overline{A_3} \cdot \overline{A_4} \cdot \overline{A_5} \cdot \overline{A_6} \cdot \overline{A_7} + \overline{PDE}) \cdot CDE$$

where, PDE represents a precharge decoder enable signal and CDE represents a column decoder enable signal.

Therefore, when all the column signals $A_0$–$A_7$ are low and when both PDE and CDE are high, this unit decoder responds with providing $Y_0$ of high level.

Figure 6:
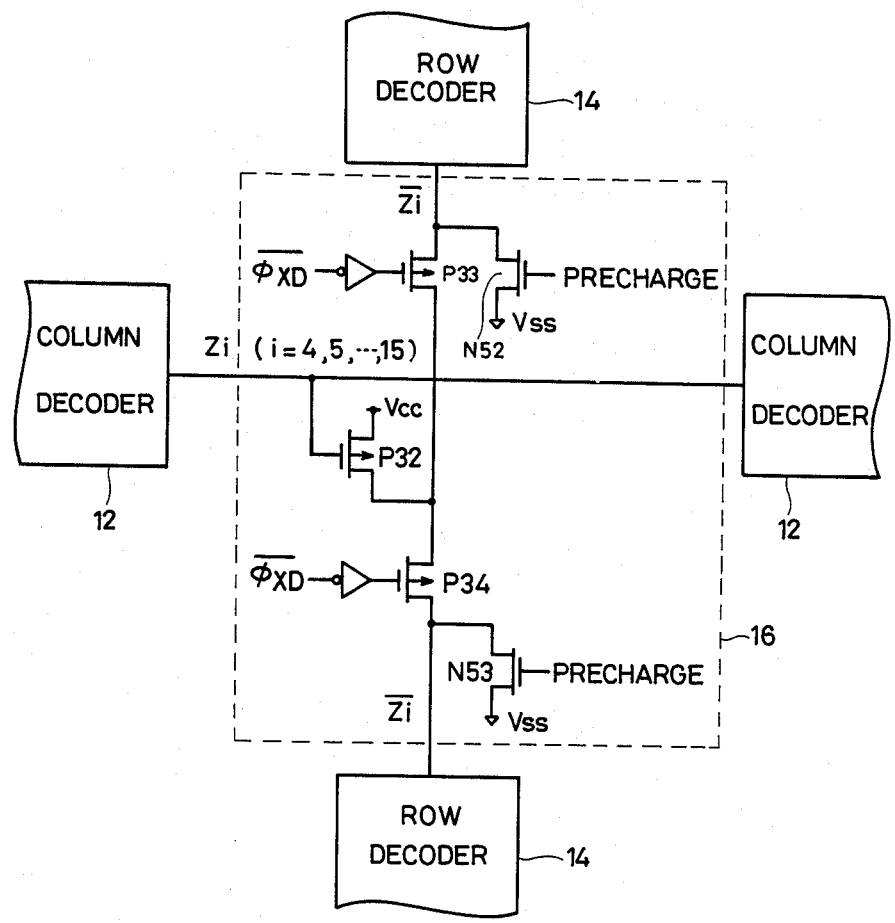
FIG. 6 shows one example of a structure of a logic inversion circuit according to the present invention.

FIG. 6 shows a structure of the logic inversion circuit shown in FIG. 3. In FIG. 6, the logic inversion circuit 16 is formed of a clocked CMOS inverter comprising p channel MOS transistors $P_{32} \sim P_{34}$ and n channel MOS transistors $N_{52}$ and $N_{53}$. The p channel MOS transistor $P_{32}$ receives at its gate an intermediate signal $Z_i$ (i=4, 5,...15) applied through a column decoder 12, one conduction terminal thereof is connected to the supply potential $V_{CC}$, and the other conduction terminal is connected to a signal line $\overline{Z_i}$ in the upper side and the lower side (in the figure) through p channel MOS transistors $P_{33}$, $P_{34}$. Namely, the pMOS transistor $P_{32}$ inverts the signal $Z_i$ to output the same.

p channel MOS transistors $P_{33}$ and $P_{34}$ both receive at their gates a signal $\overline{\phi_{XD}}$ through the inverter to be on/off controlled and transmit the output of the p channel MOS transistor $P_{32}$ to the row decoder 14 through a signal line $\overline{Z_i}$.

n channel MOS transistors $N_{52}$ and $N_{53}$ both receive a control signal PRECHARGE at their gates to be on/off controlled and, when they are rendered conductive, they connect the signal line $\overline{Z_i}$ to the ground potential $V_{SS}$. The signal $\overline{\phi_{XD}}$ is a logic inverted signal of a signal obtained by delaying a word line drive clock $\phi_X$ for activating the word line by a predetermined time period.

A control signal PRECHARGE is a signal for providing the timing of the precharge operation of the semiconductor memory generated synchronously with the signal $\overline{RAS}$. While the signal PRECHARGE is "H", the word line and bit line of the semiconductor memory are precharged. During precharging, the predecoder control signal PREDECODER ENABLE (FIG. 4) is "L" and the intermediate signal $Z_i$ (i=4, 5,...15) is "H", so that all $\overline{Z_i}$ applied to the row decoder 14 are "L".

When the memory operation of the semiconductor memory begins and the signal PRECHARGE ENABLE becomes "L" and the predecoder control signal PREDECODER ENABLE becomes "H", then the intermediate signal $Z_i$ changes in response to the external address signal applied at that time, and the signal $\overline{Z_i}$ corresponding to the intermediate signal $Z_i$ which has changed into "L" becomes "H". After the generation of a word line drive clock $\phi_X$, when the signal $\overline{\phi_{XD}}$ becomes "L", p channel MOS transistors P$\times$ and $P_{34}$ are both turned off and the $\overline{Z_i}$ signal is cut off from the $Z_i$ signal line.

Figure 7:
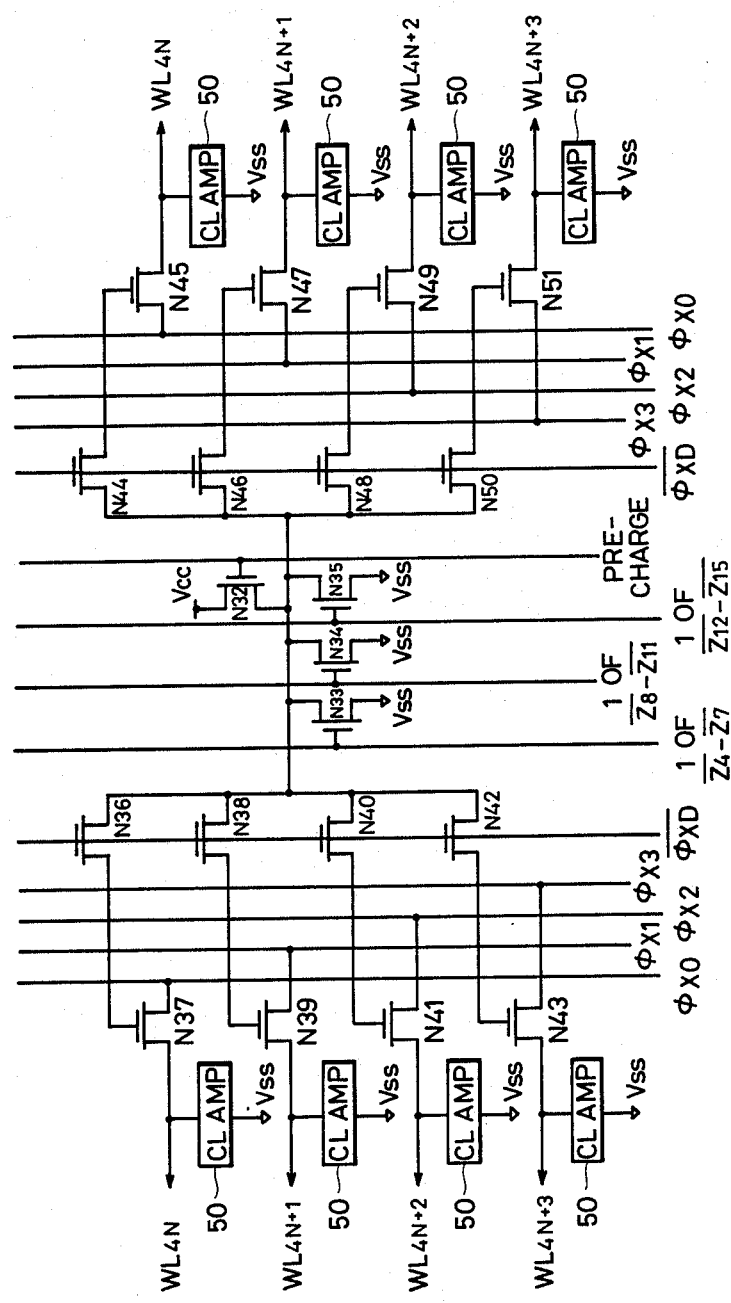
FIG. 7 shows the structure of a unit column decoder and a unit word driver circuit according to the present invention.

FIG. 7 shows the structure of an unit row decoder and an unit word driver circuit forming the row decoder and the word driver circuit shown in FIG. 3. In FIG. 7, the unit decoder is composed of an NMOS dynamic NOR circuit comprising n channel MOS transistors $N_{32} \sim N_{35}$. The nMOS transistor $N_{33}$ receives one of the intermediate signals $\overline{Z_4} \sim \overline{Z_7}$ at its gate, one conduction terminal thereof being connected to the output signal line of the NOR circuit and the other conduction terminal being connected to the ground potential $V_{SS}$. The nMOS transistor $N_{34}$ receives at its gate one of the intermediate signals $\overline{Z_8} \sim \overline{Z_{11}}$, its one conduction terminal being connected to the output signal line and the other conduction terminal being connected to the ground potential $V_{SS}$. The nMOS transistor $N_{35}$ receives at its gate one of the intermediate signals $\overline{Z_{12}} \sim \overline{Z_{15}}$, its one conduction terminal being connected to the output signal line and the other conduction terminal being connected to the ground potential $V_{SS}$ nMOS transistor $N_{32}$ receives a control signal PRECHARGE at its gate, its one conduction terminal being connected to the supply potential $V_{CC}$ and the other conduction terminal connected to the output signal line.

While the time when the signal PRECHARGE is "H", the intermediate signals $Z_i$ (i=4,...,15) are all "L" and the output signal line is precharged through the nMOS transistor $N_{32}$. When the signal PRECHARGE is "L", the NOR circuit decodes the supplied intermediate signal to transmit the same onto the output signal line. One unit word.driver circuit is composed of n channel MOS transistors $N_{36} \sim N_{42}$ while the other unit word driver circuit is composed of n channel MOS transistors $N_{44} \sim N_{51}$. N channel MOS transistors $N_{36}$, $N_{38}$, $N_{40}$ and $N_{42}$ receive the control signal $\overline{\phi_{XD}}$ at their gates, and supply the NOR circuit output to the gates of n channel MOS transistors $N_{37}$, $N_{39}$, $N_{41}$ and $N_{43}$, respectively. n channel MOS transistors $N_{37}$, $N_{39}$, $N_{41}$ and $N_{43}$ transmit decoded clocks $\phi_{X0}$, $\phi_{X1}$, $\phi_{X2}$ and $\phi_{X3}$ (the generation of $\phi_{X0} \sim \phi_{X3}$ will be described later) on the word line, respectively, in response to the signal applied to their gates and activate (select) the corresponding word line. Similarly, in the other word.driver circuit, n channel MOS transistors $N_{44}$, $N_{46}$, $N_{48}$ and $N_{50}$ are turned on and off in response to the control signal $\overline{\phi_{XD}}$ to transmit the NOR circuit output. n channel MOS transistors $N_{45}$, $N_{47}$, $N_{49}$ and $N_{51}$ are turned on and off in response to the signals transmitted from the n channel MOS transistors $N_{44}$, $N_{46}$, $N_{48}$ and $N_{50}$, respectively, and transmit the decoded clocks $\phi_{X0}$, $\phi_{X1}$, $\phi_{X2}$ and $\phi_{X3}$ to the word lines. A clamp circuit 50 is provided on each of the word lines in order to prevent the word line potential from floating to cause erroneous selection condition at the time when it is not selected. The aforementioned row decoder and the word driver circuit are structured in such a manner that the intermediate signals $\overline{Z_4} \sim \overline{Z_{15}}$ are decoded in the nMOS dynamic NOR circuit portion and the word driver circuit activates one word line by the NOR circuit output and the clocks $\phi_{X0} \sim \phi_{X3}$ obtained by decoding the word line drive clock $\phi_X$. The circuit structure shown in FIG. 7 has been conventionally employed, so that a detailed description of its operation is omitted.

Figure 8:
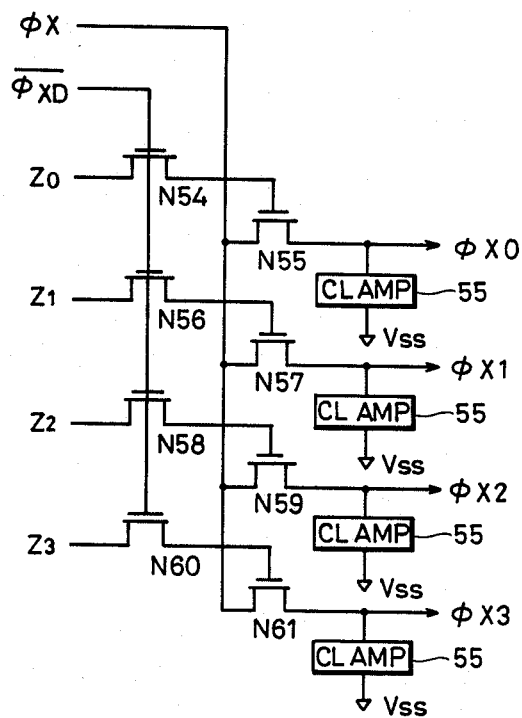
FIG. 8 shows one example of a structure of a circuit for decoding a word line drive clock $\phi_x$.

FIG. 8 shows one example of the structure of a decoder of the word line drive clock $\phi_X$.

In FIG. 8, the clock decoder is composed of n channel MOS transistors $N_{54}$, $N_{56}$, $N_{58}$ and $N_{60}$ which turn on and off in response to the signal $\overline{\phi_{XD}}$ and transmit intermediate signals $Z_0 \sim Z_3$, respectively, and n channel MOS transistors $N_{55}$, $N_{57}$, $N_{59}$ and $N_{61}$ which turn on and off in response to the signals transmitted from the n channel MOS transistors $N_{54}$, $N_{56}$, $N_{58}$ and $N_{60}$, respectively, and output the decoded clocks $\phi_{X0}$, $\phi_{X1}$, $\phi_{X2}$ and $\phi_{X3}$, respectively, by transmitting/not transmitting the clock $\phi_X$. A clamp circuit 55 is provided on each of the output signal lines of the nMOS transistors $N_{55}$, $N_{57}$, $N_{59}$ and $N_{61}$ in order to prevent the potential of the output signal line from floating which causes the erroneous decoded clock to be outputted. In this clock decoder, one of the singals $\phi_{X0} \sim \phi_{X3}$ is activated in response to the value of the intermediate signals $Z_0 \sim Z_3$. This is because one of the intermediate signals $Z_0 \sim Z_3$ becomes "H" as is apparent from the equations (11)~(14).

Figure 9:
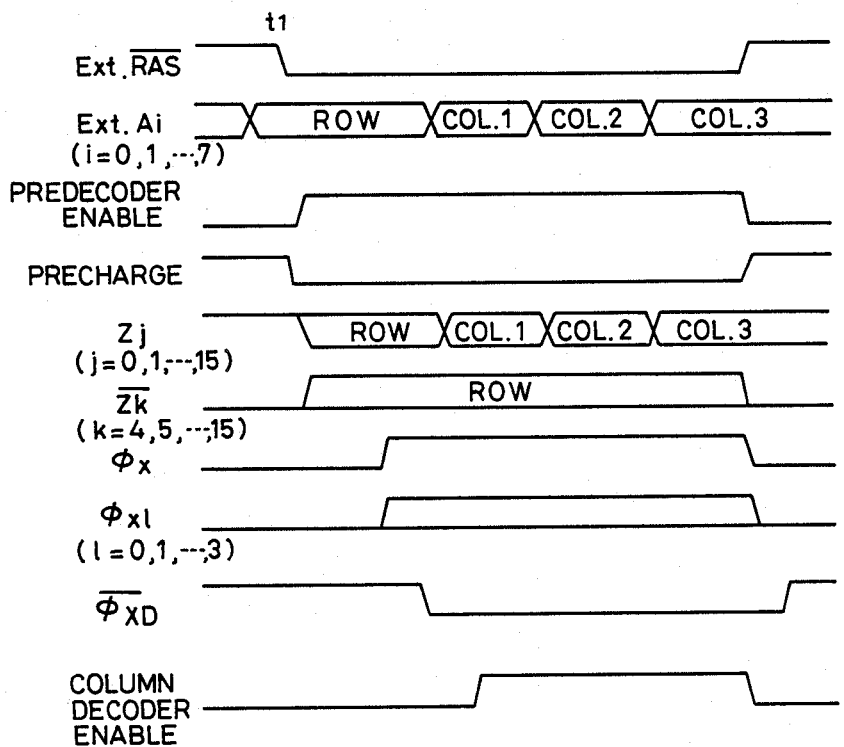
FIG. 9 is a diagram of signal wave forms showing the address.decode operation of the semiconductor memory according to the present invention.

FIG. 9 is a diagram of waveforms showing the operation timing of each part of the circuit shown in FIGS. 3 to 8. The address decode operation according to the present invention will be described with reference to FIG. 9.

While the external control signal Ext.$\overline{RAS}$ is "H", the semiconductor memory performs the precharging operation. Namely, during this period, the signal PREDECODER ENABLE is "L", the signal PRECHARGE is "H", the intermediate signal $Z_j$ (j=0,...15) is "H", the intermediate signal $\overline{Z_k}$ (k=4, 5,...15) is "L", the clock $\phi_X$ is "L", the delay clock $\phi_{Xd}$ is "H" and the signal COLUMN DECODER ENABLE is "L", so that all rows (word lines) and all columns are in the non-selection state and all dynamic NOR circuits forming the row decoder 14 are precharged.

After the row address information is set to be as the external address input signal Ext.$A_i$ (i=1, 2,...7), when the signal Ext.$\overline{RAS}$ becomes "L" at the time t1, the signal PRECHARGE becomes "L" while the signal PREDECODER ENABLE becomes "H". Accordingly, the predecoder 60 is activated and predecodes the row address supplied through the address buffer circuit 10 to output the intermediate signals $Z_0 \sim Z_{15}$. At this time, the signal COLUMN DECODER ENABLE is "L" and column decoders 12 are all in the non-selection state. On the other hand, the row decoder 4 receives the logic-inverted intermediate signal $\overline{Z_k}$ (k=4,...15) through the logic inversion circuit 16 to start decoding. After the completion of the decoding operation of the row decoder 14, when the word line drive clock $\phi_X$ becomes "H", either one of the decoded clocks $\phi_{X0} \sim \phi_{X3}$ becomes "H" in response to the value of the intermediate signal $Z_0 \sim Z_3$ at the time. Consequently, one word line is selected through a word driver circuit connected to the unit row decoder which is in the selection state. Then, when the delay clock $\overline{\phi_{XD}}$ becomes "L", the address information line $\overline{Z_i}$ in the row decoder 14 is disconnected from the address information line $Z_i$ in the column decoder 12 by the logic inversion circuit 16 (see FIG. 6). At the same time, the row decoder 14 is disconnected from the word driver circuit 15 (see FIG. 7). When the signal COLUMN DECODER ENABLE becomes "H", the column decoder 12 is activated and it decodes the intermediate signal $Z_j$ supplied from the predecoder 60 to output the corresponding column selection signal (see FIG. 5). Namely, when the column decoder 12 is activated, it selects the column corresponding to the address information at that time in response to the change of the external address input Ext.$A_i$. In the static column mode, after the selection of one row, the memory cells connected to the row are successively selected in response to the column address. When the external control signal Ext.$\overline{RAS}$ becomes "H" again, all internal signals return to the precharge state. Although only the address.decode operation is described above, other operations are similar to that of a conventional semiconductor memory, so that the description is omitted.

Although in the above embodiment a structure is shown in which the intermediate signal from the predecoder is directly supplied to the row decoder and the intermediate signal is supplied to the column decoder through the logic inversion circuit, another structure may be applied to obtain the same effect as the above embodiment in which the intermediate signal from the predecoder is directly supplied to the column decoder and the intermediate signal is supplied to the row decoder through the logic inversion circuit.

Figure 10:
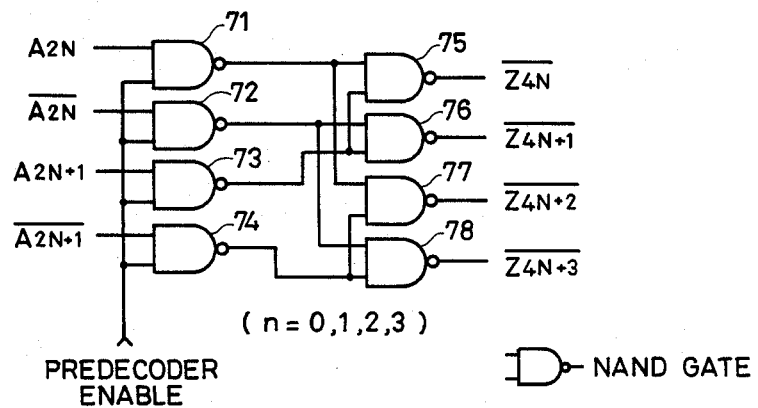
FIG. 10 shows a structure of a predecoder according to another embodiment of the present invention.

FIG. 10 shows a structure of a predecoder according to another embodiment of the present invention. In FIG. 10, a unit predecoder is composed of eight 2-input NAND gates. NAND gates 71~74 are activated when the signal PREDECODER ENABLE is "H", to output the logic inversion signal of the address input $A_{2N}$, $\overline{A_{2N}}$, $A_{2N+1}$, $\overline{A_{2N+1}}$ (N=0, 1, 2, 3), respectively. The NAND gate 75 receives the outputs from NAND gates 71 and 73, and evaluates the negative logical product thereof to output the intermediate signal $\overline{Z_{4N}}$. The NAND gate 76 receives the output from the NAND gates 72 and 73, and evaluates the negative logic product thereof to output the intermediate signal $\overline{Z_{4N+1}}$. The NAND gate 77 evaluates the negative logical product of the outputs from the NAND gates 71 and 74 to output the intermediate signal $\overline{Z_{4N+2}}$. The NAND gate 78 evaluates the negative logic product of the outputs of the NAND gates 72 and 74 to output the intermediate signal $\overline{Z_{4N+3}}$. In the above desceibed structure, the intermediate signals $\overline{Z_{4N}}$, $\overline{Z_{4N+1}}$, $\overline{Z_{4N+2}}$ and $\overline{Z_{4N+3}}$ satisfy the following equations (16)~(19).

$$\overline{Z_{4N}} = (A_{2N} + A_{2N+1}) \cdot (\text{PREDECODER ENABLE}) \quad (16)$$

$$\overline{Z_{4N+1}} = (\overline{A_{2N}} + A_{2N+1}) \cdot (\text{PREDECODER ENABLE}) \quad (17)$$

$$\overline{Z_{4N+2}} = (A_{2N} + \overline{A_{2N+1}}) \cdot (\text{PREDECODER ENABLE}) \quad (18)$$

$$\overline{Z_{4N+3}} = (\overline{A_{2N}} + \overline{A_{2N+1}}) \cdot (\text{PREDECODER ENABLE}) \quad (19)$$

Figure 11:
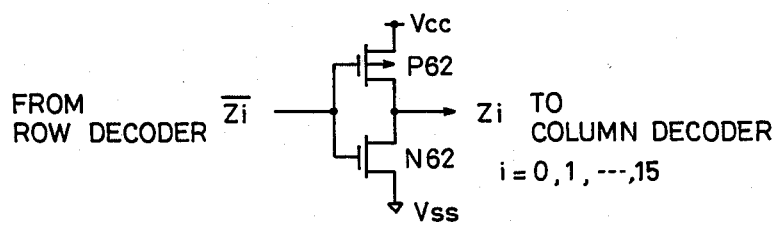
FIG. 11 shows a structure of a logic inversion circuit according to another embodiment of the present invention.

FIG. 11 shows the structure of a logic inversion circuit according to another embodiment of the present invention.

In FIG. 11, the logic inversion circuit 16 is composed of a CMOS type inverter which receives the intermediate signal $\overline{Z_i}$ (i=0,...15) from the predecoder shown in FIG. 10 and outputs the inverted intermediate signal $Z_i$. Namely, the logic inversion circuit is composed of complementary connected pMOS transistor $P_{62}$ and nMOS transistor $N_{62}$, the input thereto being the intermediate signal $\overline{Z_i}$. The output $Z_i$ from this inverter is applied to the column decoder.

As described above, according to the present invention, the row decoder and the column decoder are composed of the NOR circuit and the NAND circuit, respectively, the predecoder is used for both the row address and the column address, and a logic inversion circuit is provided for matching the logics between the row decoder and the column decoder, so that a semiconductor memory of high speed and high area-effectiveness can be implemented.

Although the present invention has been described with reference to specific embodiments, it should be understood that these embodiments are exemplary preferred embodiments and that modifications may be made without departing from the scope of the invention as defined in the appended claims.

What is claimed is:

1. A semiconductor memory having a memory cell array composed of a plurality of memory cells arranged in a matrix form of rows and columns, comprising predecoder means for receiving address information which defines a row and a column of one memory cell included in said memory array and for performing a predetermined operation to output an intermediate signal, row selection means for selecting one row defined by said address information responsive to the intermediate signal from said predecoder means, column selection means for selecting one column defined by said address information in response to the intermediate signal from said predecoder means, and logic inversion means connected to said row selection means and said column selection means for inverting at least a part of the intermediate signal from said predecoder means in response to the operation of said predecoder means to be applied to said row selection means or to said column selection means.

2. A semiconductor memory according to claim 1, wherein said intermediate signal from said predecoder means is an output of an NOR circuit, and said column selection means directly receives the intermediate signal from said predecoder means while said row selection means receives the intermediate signal from said predecoder means through said column selection means and said logic inversion means.

3. A semiconductor memory according to claim 1, wherein said intermediate signal from said predecoder means is an output of an NAND circuit and, said row selection means directly receives the intermediate signal from said predecoder means while said column selection means receives said intermediate signal from said predecoder means through said row selection means and said logic inversion means.

4. A semiconductor memory according to claim 1, wherein said semiconductor memory is a dynamic random access memory capable of static.column operation.

* * * * *